(12) United States Patent
Stolyar et al.

(10) Patent No.: US 7,136,568 B2
(45) Date of Patent: Nov. 14, 2006

(54) METHOD AND ASSEMBLY FOR ALIGNING OPTICAL COMPONENTS

(75) Inventors: Mark G. Stolyar, Richardson, TX (US); James L. Smaniotti, Allen, TX (US); Tuffik Kuri, El Paso, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/118,134

(22) Filed: Apr. 29, 2005

(65) Prior Publication Data

US 2005/0244129 A1 Nov. 3, 2005

Related U.S. Application Data

(60) Provisional application No. 60/566,905, filed on Apr. 30, 2004.

(51) Int. Cl.
*G02B 6/00* (2006.01)

(52) U.S. Cl. .......................................... 385/147; 385/88

(58) Field of Classification Search ................. 385/49, 385/52, 88–94, 147; 372/43.01; 257/99, 257/433, 434, 678, 680; 359/513
See application file for complete search history.

(56) References Cited

U.S. PATENT DOCUMENTS 5,808,325 A * 9/1998 Webb ........................... 257/99
6,314,117 B1 * 11/2001 Heim et al. ............... 372/43.01

* cited by examiner

*Primary Examiner*—Phan Palmer
(74) *Attorney, Agent, or Firm*—Workman Nydegger

(57) ABSTRACT

A method an assembly for aligning a TO window can and a TO header is provided. The present invention includes a die assembly having an upper die with forming details disposed thereon and a lower die which holds the TO header. The upper die and the lower die close such that the forming details form notches on the TO header. When the TO window can is fitted to the TO header, the TO window can engages with the notches on the TO header. If the TO window can and the TO header do not properly align, the notches may be increased in size until the proper alignment between the TO window can and the TO header is achieved.

19 Claims, 3 Drawing Sheets

METHOD AND ASSEMBLY FOR ALIGNING OPTICAL COMPONENTS

CROSS-REFERENCE TO RELATED APPLICATIONS

This application claims the benefit of U.S. Provisional Application No. 60/566,905, filed Apr. 30, 2004 and entitled METHOD AND ASSEMBLY FOR ALIGNING OPTICAL COMPONENTS, which is hereby incorporated by reference.

BACKGROUND OF THE INVENTION

1. Field of the Invention

The present invention relates to optical components and more specifically to a method and an apparatus that aligns optical components.

2. Discussion of the Related Art

Electronic devices play an increasingly critical role in the lives of many consumers today. Many of these devices read and transfer data using optoelectronics. These devices typically employ light emitting components such as photodiodes, laser diodes and vertical cavity surface emitting lasers (VCSELs).

Many advances have been made over the years which facilitate optically reading data and then transferring the data. These advances include photodiodes having multiple light sources, such as edge-emitting diodes which emit coherent light or infrared energy and VCSELs. In applications incorporating VCSEL technology, electronic devices have integrated circuits that include lasers which emit a fixed beam of light. Typically, these integrated circuits emit a fixed beam of light into a glass fiber. A related art example of a device which may be used to emit light in VCSEL type applications is shown in FIG. 1.

FIG. 1 is a perspective view of a TO header 100. The TO header 100 includes a pedestal 101 with an integrated circuit 102 disposed thereon between leads 104. The integrated circuit 102 includes a light emitter 102a which emits light during operation of the integrated circuit 102. The TO header 100 hermetically seals with a TO can when the TO header 100 is used in an optoelectrical device. The TO can interfaces with the TO header 100 about a periphery 108 of the TO header 100. More specifically, an inner diameter of the TO can fits about an outer diameter of the TO header 100. During operation of an optoelectrical device implementing the TO header 100, light emitted from the light emitter 102a passes through the TO can and into an optical fiber. Therefore, precise alignment/orientation and/or center line offset fit between the TO header 100 and the TO can is required in order to ensure proper operation of the device. Furthermore, the requirement exists when the TO header 100 and the TO can must be pre-assembled prior to a sealing operation and the assembly must maintain orientation and fit.

Typically, both the TO can and the TO header 100 are made by separate manufacturers and assembled by a user of an optoelectrical device incorporating both the TO header and the TO can. Often times, separate manufacturers have different manufacturing tolerances such that the TO can may not fit precisely about the periphery of the TO header. To further illustrate, the inner diameter of the TO can may have a dimension that substantially differs from an outer diameter of the periphery of the TO header due to differences in manufacturing tolerances. Therefore, the TO can floats relative to the TO header after installation during operation of the optoelectrical device.

Understandably, in order to accurately emit a fixed beam of light into a glass fiber, precise alignment of the integrated circuit relative to the TO can is required. More importantly, proper operation of the above-mentioned applications hinge on the ability to precisely emit light into a fiber optic. However, if the TO can floats relative to the TO header, obscured alignment may occur. The obscured alignment may interfere with the reliability and the overall operation of an optoelectrical device using the aforementioned assembly.

As such, a need exists for an assembly which minimizes float of a TO can hermetically sealed with a TO header. In addition, a need exists for a method and apparatus which allows variability in fitment between a TO can and a TO header.

SUMMARY OF THE INVENTION

Accordingly, the present invention is directed to a method and assembly for aligning optical components that substantially obviates one or more of the problems due to limitations and disadvantages of the related art.

An advantage of the present invention is to provide an apparatus which machines a TO header according to dimensional characteristics of a TO can.

Another advantage of the present invention is to provide an apparatus which allows for precise fitment between a TO can and a TO header.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method for aligning a TO can and a TO header using a die is disclosed. The method includes forming a notch in the TO header using forming details disposed on the die. The method also includes fitting the TO can with the TO header where an inner diameter of the TO can engages with the TO header notch.

In another aspect of the present invention, a die assembly for precision alignment of a TO can with a TO header is disclosed. The die assembly includes an upper die and a lower die. The upper die has forming details disposed thereon. The lower die includes a cavity for holding the TO header. The upper die forming details correspond to a periphery of the TO header during use of the die assembly.

In yet a further aspect of the present invention, a method for aligning a TO header and a TO window can using a die is disclosed. The method comprises forming notches in the TO header using forming details disposed in the die. Moreover, the method includes determining if the TO window can and the TO header properly align with one another. An inner diameter of the TO window can engages with the TO header notches when the TO header and the TO can align with one another. The method also includes increasing a dimension of the TO header notches using the die forming details if it is determined that the TO window can and the TO header are not properly aligned.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 2:
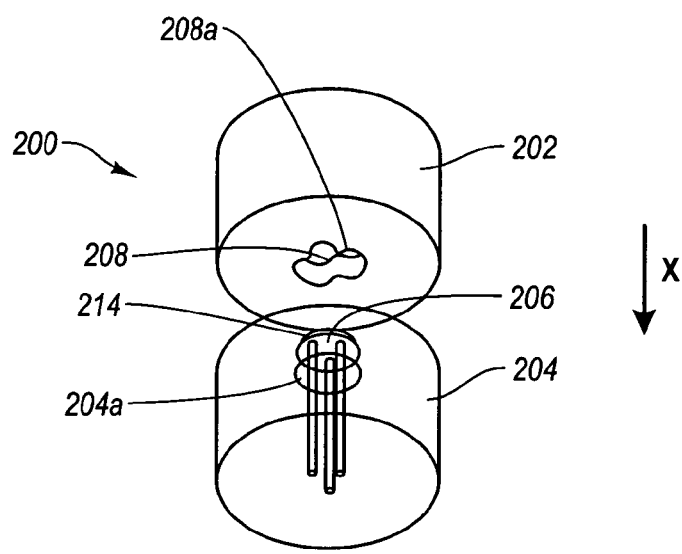
FIG. 2 is a perspective view of a die which processes a TO header in accordance with an embodiment of the present invention.

FIG. 2 is a perspective view of a die 200 which machines a transistor outline (TO) header 206 in accordance with an exemplary embodiment of the present invention. The die 200 includes an upper die 202 and a lower die 204. The lower die 204 includes a cavity 204a in which the TO header 206 resides during press operations. The lower die 204 mounts any suitable block set capable of stabilizing the lower die 204 during press operations.

The upper die 202 includes a forming detail 208 having forming details 208a. The forming details 208a coin a pattern into a pedestal 214 of the TO header 206 (FIG. 3) during press operations, as will be discussed in greater detail further on. The forming details 208a are machined into the upper die 202 during formation of the upper die 202. In this embodiment of the present invention, the forming details correspond with a periphery of the TO header 206. It should be noted that in embodiments where the upper die 202 is employed in press fit applications, the forming details 208a are equally spaced apart from one another as shown in FIG. 2.

Figure 3:
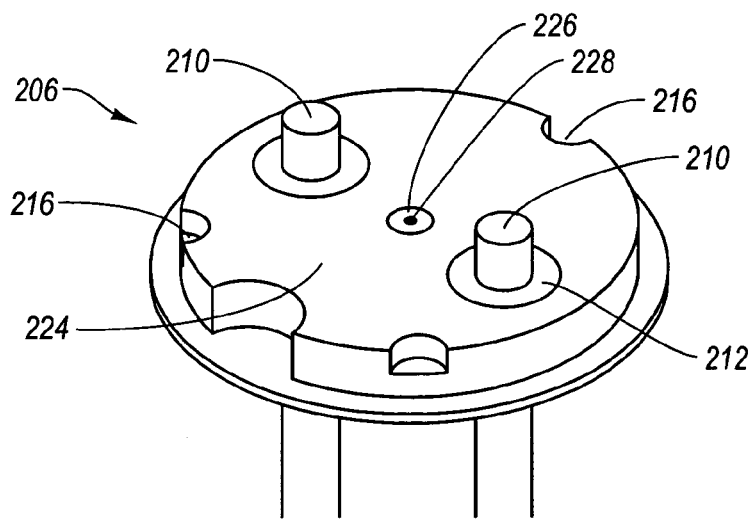
FIG. 3 is a perspective view of a TO header in accordance with an embodiment of the present invention.

FIG. 3 is a perspective view of the TO header 206 in accordance with an embodiment of the present invention. The TO header 206 may be metal where the TO header 206 is stamped to achieve the configuration shown in FIG. 3. In this embodiment, the TO header 206 includes an integrated circuit 226 having a light emitter 228. However, it should be noted that the TO header 206 may include any number of functional elements such that the TO header 206 provides functionality to a device implementing the same.

The TO header 206 includes leads 210 which provide electrical connectivity to the integrated circuit 226. In this embodiment, the leads 210 may be constructed of iron compound or any suitable material that provides electrical connectivity. The leads 210 couple with the TO header 206 using seals 212. The seals 212 (seals may be formed, for example, from glass) may be any type of seal which hermetically seal the leads 210 with the TO header 206, such as glass seals or the like. The seals 212 seal the leads 210 with a pedestal 214 of the TO header 206.

The pedestal 214 provides a platform for the TO header 206 in which various components, such as the integrated circuit 226 and the light emitter 228, reside. The pedestal 214 includes notches 216 which increase a circumference of the pedestal 214. In addition, the pedestal 214 provides an interface between the TO header 206 and a TO window can 218 (FIG. 4) when the TO header 206 integrates with the TO window can 218, as shown in greater detail in FIG. 4.

Figure 4:
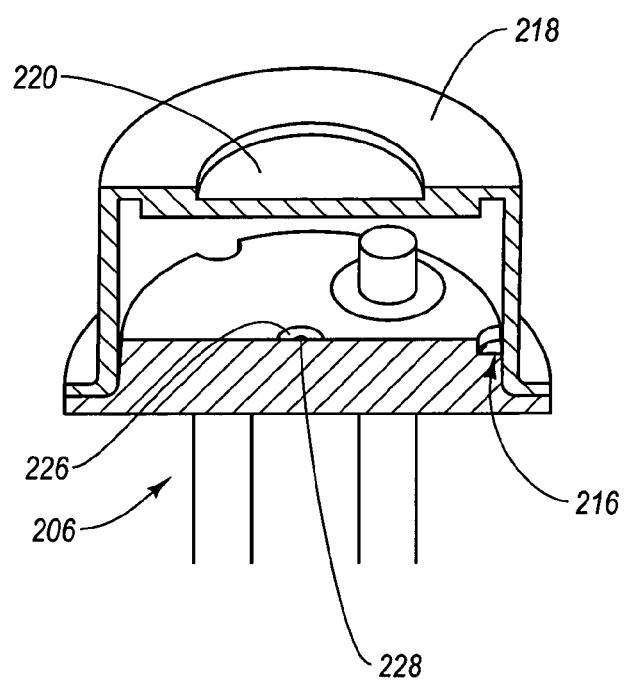
FIG. 4 is a perspective view of a TO header hermetically sealed with a TO window can in accordance with an embodiment of the present invention.

FIG. 4 is a perspective view of the TO header 206 hermetically sealed with the TO window can 218 in accordance with an embodiment of the present invention. The TO window can 218 hermetically seals the TO header 206 thereby maintaining a precise orientation and fit of the light emitter 228 relative a window 220 of the TO window can 218 when the TO header 206 and the TO window can 218 are pre-assembled prior to integration with a device. In accordance with an embodiment of the present invention, the TO header 206 through any suitable methods, including resistance welding or solder reflow operations is sealed to the TO window can 218. The window 220 allows the passage of light emissions from the light emitter 228 through the TO window can 218. As discussed above, alignment between the window 220 and the light emitter 228 must be maintained in order to allow proper functionality of a device using the TO header 206. The TO window can 218 hermitically seals and aligns with the TO header 206 at the pedestal 214. More specifically, with reference to FIG. 5, an inner diameter 222 of the TO window can 218 engages with an outer diameter 224 of the pedestal 214.

Figure 5:
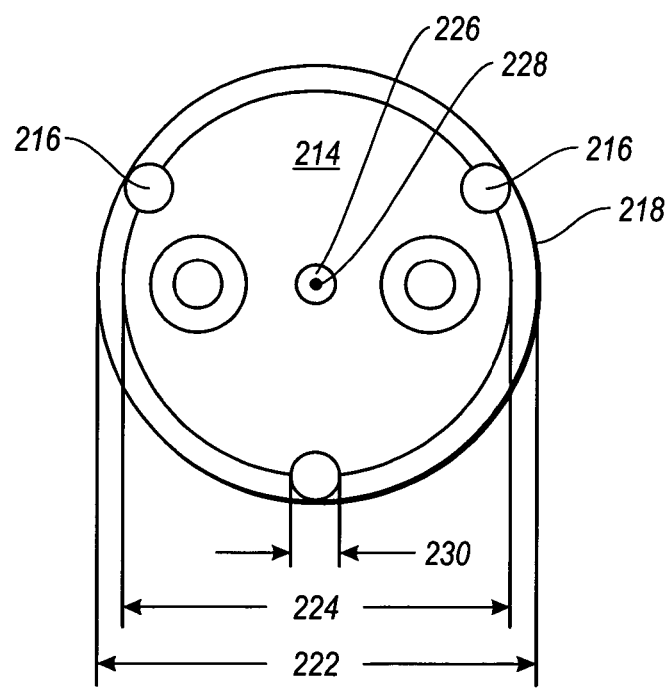
FIG. 5 is a top view of a TO window can engaging with a pedestal of a TO header in accordance with an embodiment of the present invention.

FIG. 5 is a top view of the TO window can 218 engaging with the pedestal 214 of the TO header 206 in accordance with an embodiment of the present invention. The TO window can inner diameter 222 engages with the notches 216 of the pedestal 214 such that the notches 216 maintain a position of the TO window can 218. Advantageously, the notches 216 maintain the position of the TO window can 218 such that an alignment and orientation between the window 220 and the light emitter 228 is maintained. The notches 216 are formed with the die 200 as discussed below.

When a user integrates the TO window can 218 with the TO header 206, the user determines if the TO window can 218 floats relative to the TO header 206. In one embodiment, if the alignment between the TO header 206 and the TO window can 218 is such that the TO window can 218 moves about 0.001 inch then the TO window can 218 may float relative to the TO header 206. The user then places the TO header 206 in the lower die 204 and force is applied to close the upper die 202 and the lower die 204. When the upper die 202 contacts the TO header 206 and continues moving, the notches 216 form in the TO header 206 by compressive forces from the upper die 202. More specifically, the forming details 208a engage with the circumference of the pedestal 214 and move in a downward direction. The forming details 208a displace a controlled amount of material from the circumference of the pedestal 214 in an outward direction thereby forming the notches 216. The notches 216 are formed such that the notches 216 have a dimension 230 as shown in FIG. 5. Furthermore, in accordance with an embodiment of the present invention, the die 200 may be precisely controlled such that the displacement of the pedestal 214 and the formation of the notches 216 may be precisely controlled.

Once the notches 216 are formed, a user fits the TO window can 218 onto the TO header 206. As may be seen in FIG. 5, the notches 216 engage with the TO window can inner diameter 222. Thus, the notches 216 maintain concentricity between the TO header 206 and the TO window can 218. If the TO window can 218 moves relative to the TO header 206 after fitment with the pedestal 214, such that the light emitter 228 and the window 220 fall out of alignment, the user may increase the dimension 230 of the notches 216. The user places the TO header 206 back in the lower die 204 and moves the upper die 202 discussed above, thereby increasing the dimension 230 of the notches 216.

After increasing the dimension 230 of the notches 216, the TO window can 218 is refit onto the TO header 206. If the TO window can 218 fits on the TO header 206 such that the light emitter 228 and the window 220 will not fall out of alignment, then the TO window can 218 may be sealed with the TO header 206 and the assembly may be integrated with a device. Otherwise, the process of forming the dimension 230 is repeated until the TO window can 218 fits on the TO header 206 such that alignment between the light emitter 228 and the window 220 remains during use of an assembly formed by the TO window can 218 and the TO header 206.

Figure 6:
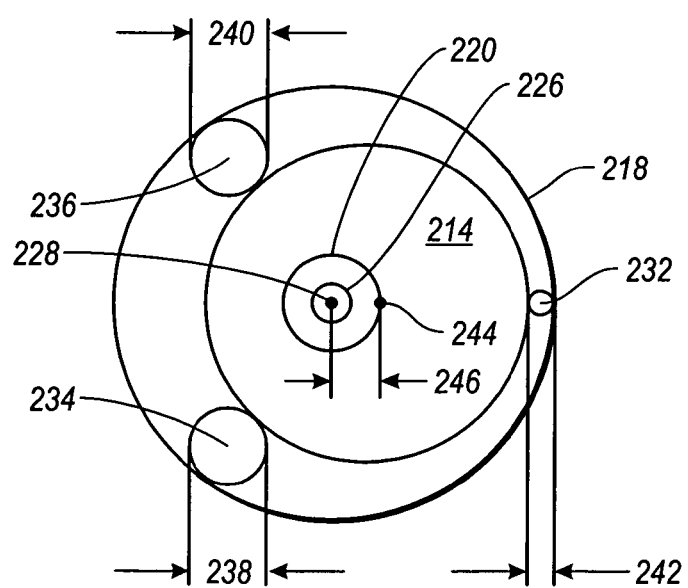
FIG. 6 is an embodiment of the present invention illustrating an offset center alignment of an integrated circuit and a light emitter relative to a pedestal.
Figure 1:
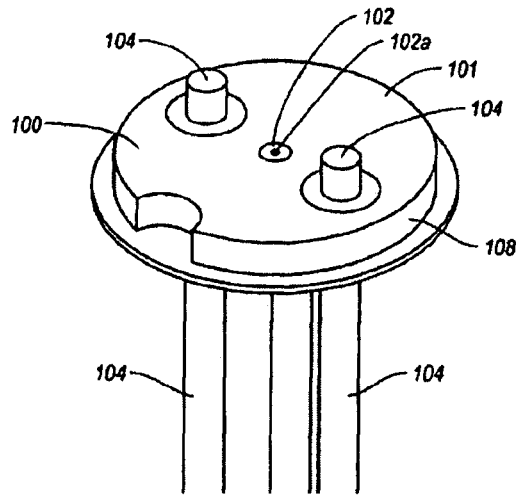
Figure 3:
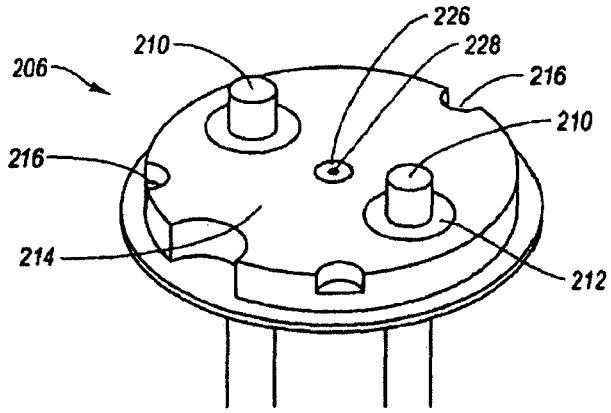

In an alternative embodiment, the present invention accounts for offset center alignment of the light emitter 228 relative to the pedestal 214, as shown with reference to FIG. 6. FIG. 6 is an embodiment of the present invention illustrating an offset center alignment of the integrated circuit 226 and the light emitter 228 relative to the pedestal 214. As may be seen with reference to FIG. 6, the integrated circuit 226 and the light emitter 228 are offset from a center 244 of the pedestal 214. In order to account for the resultant offset axis of the light emitter 228, the TO window can 218 may be offset relative to the pedestal 214 such that the TO window can 218 maintains alignment between the light emitter 238 and the window 220.

In this embodiment of the present invention, notches 232, 234 and 236 having dimensions 238, 240 and 242 may be formed in the pedestal 214. As previously discussed, notches disposed about the circumference of the pedestal 214 position the TO window can 218 relative to the integrated circuit 236 and the light emitter 238. Therefore, in this embodiment, the dimensions of the notches 232, 234 and 236 may be adjusted independently of one another in order to maintain an alignment between the window 220 and the light emitter 228. To further illustrate, in the embodiment shown in FIG. 6, the dimensions 238, 240 and 242 differ from one another in order to account for the offset alignment of the light emitter 228 relative to the pedestal center 244. More specifically, the light emitter 228 is offset a distance 246 from the pedestal center 244. Thus, the notches 232, 234 and 236 are sized to account for the offset distance 246 such that the window 220 aligns with the light emitter 228 when the TO window can 218 seals with the TO header 206.

The notches 232, 234 and 236 may be sized according to an amount offset between the light emitter 228 and the pedestal center 244. Thus, the pedestal 214 may be configured to align the TO window can 218 and the window 220 with the light emitter 228 regardless of the position of the light emitter 228 relative to the pedestal 214.

As may be appreciated, the present invention allows for variability between the TO window can 218 and the TO header 206. In particular, if the TO header 206 and the TO window can 218 are manufactured to different tolerances such that a substantial difference exists between the outer diameter 224 of the pedestal 214 and the inner diameter 222 of the TO window can 218, the present invention may be used to ensure proper fit between the TO window can 218 and the TO header 206 irrespective of existing manufacturing gaps. Thus, embodiments of the present invention allow for precision orientation and/or center line offset fit between the TO header 206 and the TO window can 218.

In addition, the notches 216 allow for a light press fit between the TO header 206 and the TO window can 218. The upper die 202 and the lower die 204 machine the TO header 206 such that the TO header 206 and the TO window can 218 fit within several tenths of a thousand of an inch, for example. Therefore, the TO components, namely the TO header 206 and the TO can 218, can be pre-assembled in a required angular orientation and transferred to a sealing operation without the individual components (e.g., the TO header 206 and the TO window can 218) losing an orientation with respect to one another.

As may be appreciated, the present invention provides a method and assembly which minimizes float between the TO components in an optoelectrical device. Furthermore, the present invention minimizes problems associated with different manufacturing tolerances. More specifically, the present invention provides a method and assembly which provides precise fitment between a TO header and a TO window can irrespective of manufacturing tolerances.

It will be apparent to those skilled in the art that various modifications and variations can be made in the present invention without departing from the spirit or scope of the invention. Thus, it is intended that the present invention cover the modification and variations of this invention provided they come within the scope of the appended claims and their equivalents.

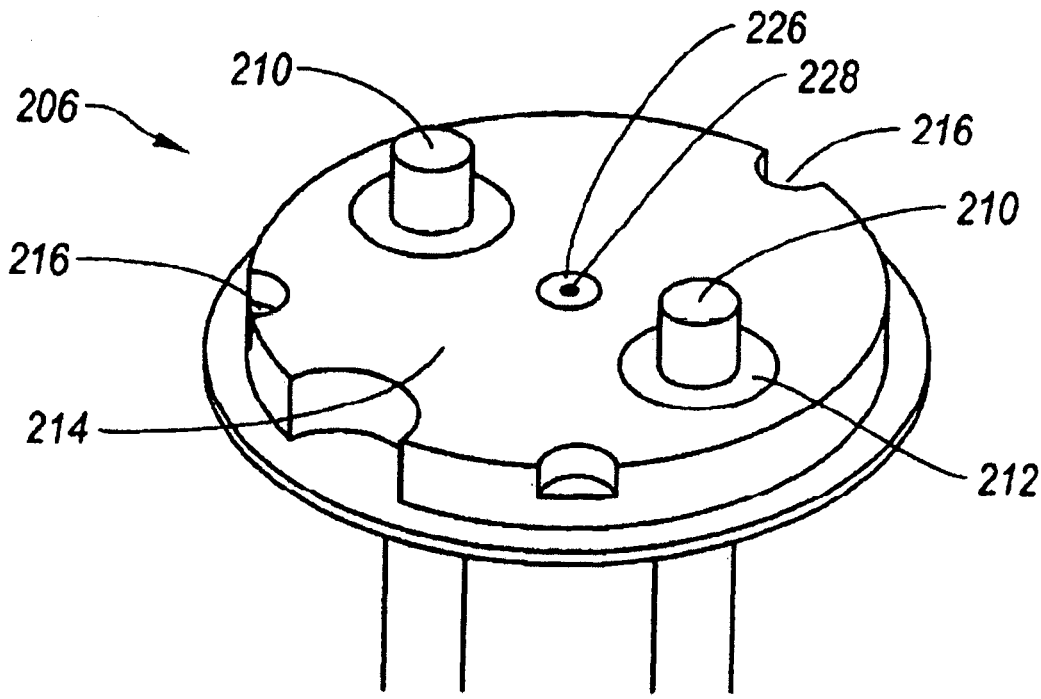

What is claimed is:

1. A method for aligning a TO can and a TO header using a die, the method comprising the steps of:
    forming a notch in the TO header using a forming detail disposed on the die; and
    fitting the TO can with the TO header where an inner diameter of the TO window can engages the notch in the TO header.

2. The method as recited in claim 1, wherein the TO header comprises:
    a pedestal having an outer diameter wherein the TO header notch is formed in the pedestal outer diameter.

3. The method as recited in claim 2, wherein the TO header further comprises:
    a light emitter.

4. The method as recited in claim 3, wherein the TO header includes a second notch formed therein.

5. The method as recited in claim 4, wherein the light emitter is offset from a center of the TO header.

6. The method as recited in claim 5, wherein the step of forming a notch in the TO header further comprises:
    forming the notch and the second notch offset from the center of the TO header such that the TO can aligns with the light emitter.

7. The method as recited in claim 3, wherein the TO can comprises:
    a window, wherein the light emitter and the window align with one another when the TO window can and the TO header properly align.

8. The method as recited in claim 2 further comprising the steps of:
    determining if the TO can is aligned with the TO header.

9. The method as recited in claim 8, further comprising the steps of:
    increasing a dimension of the notch in the TO header if it is determined that the TO can is not properly aligned with the TO header.

10. A die assembly for precision alignment of a TO can with a TO header, the assembly comprising:
    an upper die having forming details disposed thereon; and
    a lower die having a cavity for holding the TO header, wherein the upper die forming details corresponds with a periphery of the TO header during use of the assembly.

11. A die assembly as recited in claim 10, wherein the forming details are equally spaced apart from one another.

12. A method for aligning a TO header and a TO window can using a die, the method comprising the steps of:
    forming a notch in the TO header using a forming detail disposed on the die;
    determining if the TO window can and the TO header are properly aligned with one another where an inner diameter of the TO window can engages with the TO header notch; and
    increasing a dimension of the TO header notch using the die forming details if it is determined that the TO window can and the TO header are not properly aligned.

13. The method as recited in claim 12, wherein the TO header comprises:
    a pedestal having an outer diameter, wherein the TO header notches are formed in the pedestal outer diameter.

14. The method as recited in claim 13, wherein the TO header further comprises:
    a light emitter.

15. The method as recited in claim 14, wherein the TO header includes a second notch formed therein.

16. The method as recited in claim 15, wherein the light emitter is offset from a center of the TO header.

17. The method as recited in claim 16, wherein the step of forming a notch in the TO header further comprises:
    forming the notch and the second notch offset from the center of the TO header such that the TO can aligns with the light emitter.

18. The method as recited in claim 17, wherein the step of forming a notch in the TO header further comprises:
    forming the notch with a first dimension; and
    forming the second notch with a second dimension that is different from the first dimension.

19. The method as recited in claim 14, wherein the TO window can comprises:
    a window, wherein the light emitter and the window align with one another when the TO window can and the TO header properly align.

* * * * *

UNITED STATES PATENT AND TRADEMARK OFFICE
CERTIFICATE OF CORRECTION

PATENT NO. : 7,136,568 B2
APPLICATION NO. : 11/118134
DATED : November 14, 2006
INVENTOR(S) : Stolyar et al.

It is certified that error appears in the above-identified patent and that said Letters Patent is hereby corrected as shown below:

Delete Title page illustrating a figure, and substitute therefor, new Title page illustrating a figure. (attached)

<u>Title Page</u>
Replace the title page figure with the figure depicted herein below, wherein the reference "224" has been changed to --214--.

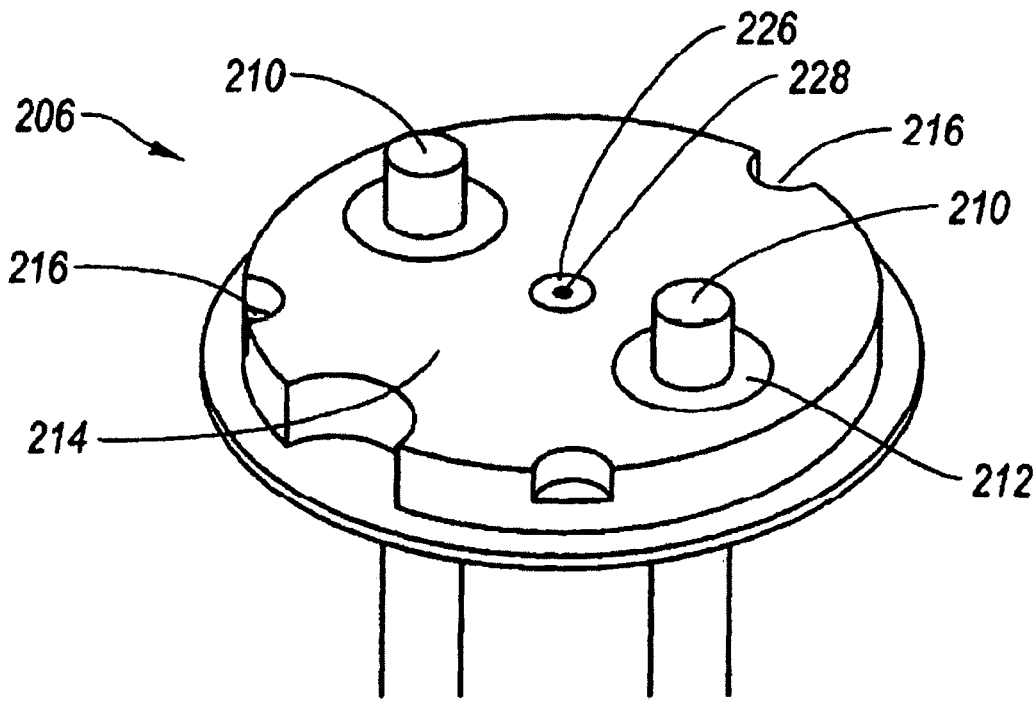

Signed and Sealed this

Twenty-third Day of November, 2010

David J. Kappos
*Director of the United States Patent and Trademark Office*

Figure 1:
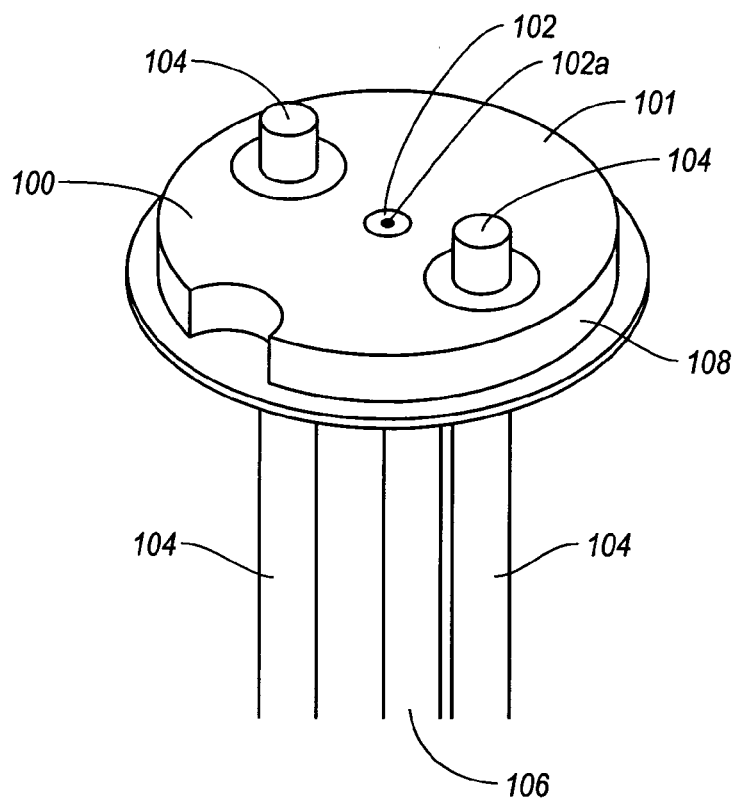
FIG. 1 is a TO header in accordance with the related art.

Drawings
Sheet 1, replace Fig. 1 with the figure depicted herein below, wherein the reference number [106] has been removed.

Drawings
Sheet 2, replace Fig. 3 with the figure depicted herein below, wherein the reference "224" has been changed to --214--.

Column 4
Line 30, remove [222].

Column 5
Line 33, change "238" to --228--.

CERTIFICATE OF CORRECTION (continued)

(12) United States Patent
Stolyar et al.

(10) Patent No.: US 7,136,568 B2
(45) Date of Patent: Nov. 14, 2006

(54) METHOD AND ASSEMBLY FOR ALIGNING OPTICAL COMPONENTS

(75) Inventors: Mark G. Stolyar, Richardson, TX (US); James L. Smaniotti, Allen, TX (US); Tuffik Kuri, El Paso, TX (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 11/118,134

(22) Filed: Apr. 29, 2005

(65) Prior Publication Data
US 2005/0244129 A1  Nov. 3, 2005

Related U.S. Application Data

(60) Provisional application No. 60/566,905, filed on Apr. 30, 2004.

(51) Int. Cl.
*G02B 6/00* (2006.01)
(52) U.S. Cl. ........................... 385/147; 385/88

(58) Field of Classification Search ............... 385/49, 385/52, 88–94, 147; 372/43.01; 257/99, 257/433, 434, 678, 680; 359/513
See application file for complete search history.

(56) References Cited
U.S. PATENT DOCUMENTS
5,808,325 A * 9/1998 Webb ..................... 257/99
6,314,117 B1 * 11/2001 Heim et al. ............ 372/43.01

* cited by examiner

*Primary Examiner*—Phan Palmer
(74) *Attorney, Agent, or Firm*—Workman Nydegger

(57) ABSTRACT

A method an assembly for aligning a TO window can and a TO header is provided. The present invention includes a die assembly having an upper die with forming details disposed thereon and a lower die which holds the TO header. The upper die and the lower die close such that the forming details form notches on the TO header. When the TO window can is fitted to the TO header, the TO window can engages with the notches on the TO header. If the TO window can and the TO header do not properly align, the notches may be increased in size until the proper alignment between the TO window can and the TO header is achieved.

19 Claims, 3 Drawing Sheets